United States Patent [19]

Barraclough et al.

[11] Patent Number: 5,349,921
[45] Date of Patent: Sep. 27, 1994

[54] GROWING SEMICONDUCTOR CRYSTALLINE MATERIALS

[75] Inventors: Keith G. Barraclough; Robert W. Series, both of Malvern, England

[73] Assignee: Her Majesty the Queen in right of Canada, as represented by The Secretary of State for Defence in Her Britannic Majesty's Government of the United Kingdom of Great Britain and Northern Ireland, London, England

[21] Appl. No.: 585,075

[22] PCT Filed: Mar. 6, 1989

[86] PCT No.: PCT/GB89/00220

§ 371 Date: Oct. 12, 1990

§ 102(e) Date: Oct. 12, 1990

[87] PCT Pub. No.: WO89/08731

PCT Pub. Date: Sep. 21, 1989

[30] Foreign Application Priority Data

Mar. 8, 1988 [GB] United Kingdom ............. 8805478

[51] Int. Cl.$^5$ .................................. C30B 15/20
[52] U.S. Cl. .................................. 117/13; 117/32; 117/917
[58] Field of Search ............ 156/602, 617.1, 618.1, 156/619.1; 422/249

[56] References Cited

U.S. PATENT DOCUMENTS

| | | | |
|---|---|---|---|
| 4,508,970 | 4/1985 | Ackerman | 156/601 |
| 4,565,671 | 1/1986 | Matsutani et al. | 422/249 |
| 4,592,895 | 6/1986 | Matsutani et al. | 156/601 |
| 4,617,173 | 10/1986 | Latka | 156/601 |
| 4,705,591 | 11/1987 | Carle et al. | 156/617.5 P |
| 4,830,703 | 5/1989 | Matsutani | 156/601 |
| 4,849,188 | 7/1989 | Takasu et al. | 156/617.1 |

FOREIGN PATENT DOCUMENTS 2144338A of 1985 United Kingdom.
2143746A 2/1985 United Kingdom.
2163672A of 1986 United Kingdom.

OTHER PUBLICATIONS

Patent Abstracts of Japan, vol. 9, No. 160 (C-289) (1883), 4 Jul. 1985 & JP, A, 6033296 (Toshiba Ceramics K.K.) 20 Feb. 1985.
Pat. Abstracts of Japan, vol. 9, No. 218 (C-301) (1941), Sep. 5/85; & JP A 6081086 (Shinetsu HJandoutai K.K.) May 9, 1985.
Pat. Abstracts of Japan, vol. 9, No. 160 (C-289) (1883), Jul. 4, 1985, & JP A, 6033287 (Toshiba K.K.), Feb. 20, 1985.
Pat. Abstracts of Japan, vol. 9, No. 160 (C-289) (1883), Jul. 4, 1985, & JP A, 6033298 (Toshiba Ceramics K.K.) 20 Feb. 1985.

*Primary Examiner*—R. Bruce Breneman
*Assistant Examiner*—Felisa Garrett
*Attorney, Agent, or Firm*—Nixon & Vanderhye

[57] ABSTRACT

Semiconductor crystalline materials, e.g. silicon, GaAs, are grown from a melt, e.g. using the Czochralski technique where a seed crystal is dipped into the melt then slowly withdrawn. Rotation of the growing crystal (6) is partly responsible for convective flows within the melt (5). Convective flows are reduced while radial uniformity is improved by subjecting the crystal/melt interface to a shaped magnetic field. This magnetic field is rotationally symmetrical about the axis of crystal rotation, with a component of field parallel to this axis that is less than 500 gauss, preferably less than 200 gauss, with a value above 500 gauss at other parts of the melt. The field may be produced by two superconducting magnet coils (21, 22) spaced apart and arranged co-axially with the axis of crystal rotation.

4 Claims, 4 Drawing Sheets

AXIAL    RADIAL
MAGNETIC FIELD - GAUSS

GROWING SEMICONDUCTOR CRYSTALLINE MATERIALS

BACKGROUND OF THE INVENTION

1. Field of the Invention

The invention relates to a method and apparatus for growing semiconductor crystalline materials in which a melt of the growing crystal is subjected to a magnetic field.

2. Discussion of Prior Art

Electronic devices are fabricated on wafers of semiconductor crystals. The properties of the semiconductor are heavily dependent on the specific impurities present in the wafers. Not all impurities are deleterious, and successful fabrication of electronic devices requires the control of the distribution and concentration of the impurities. For most electronic devices the starting material comprises a slice of wafer cut from a single crystal of the semiconductor, commonly either silicon or gallium arsenide. The crystal is in turn pulled from a melt. An object of this invention is an improvement to the techniques for the growth of semiconductor crystals which leads to improved homogeneity of certain impurities in the crystal.

Semiconductor crystals are for the most part grown from melts of the semiconductor in a crystal pulling apparatus. To control the electrical properties of the crystals, small quantities of specific impurities or dopants are added to the melt. One of the major problems in the production of crystals is to achieve control over the uniformity and concentration of dopants within the crystal.

During the growth process differences in composition or temperature between differing regions of the melt lead to density variations in the melt which can in turn have undesirable effects on the incorporation of impurities within the growing crystal and lead to the formation of localised fluctuations of impurity concentrations known as striae.

SUMMARY OF THE INVENTION

Often, during crystal growth, the crystal and sometimes other parts of the apparatus are rotated to provide uniformity within the growing crystal. These rotations are also partly responsible for setting up convective flows within the melt. The form of these convective flows greatly affects the quality of the growing crystal and can help to promote uniformity of the crystal. One effect of the rotation of the crystal is to set up a convective motion in the melt ahead of the growing crystal as a result of the centrifugal pumping action of the rotating crystal. Such crystal rotation driven flow is generally desirable as it results in an improved radial uniformity to the crystal.

In recent years much interest has been displayed in the potential for damping of the convective flows in the melt through the application of externally applied magnetic fields. The melts of semiconductors are generally good electrical conductors and it is well established that it is possible to damp the convective flows within the melts by the application of a static magnetic field to the melt. This can lead to greatly differing patterns of incorporation of impurity within the crystal.

To date two geometries have been widely reported. In the so called axial systems a coil is placed co-axially with the rotation axis of the crystal so as to generate a field in the melt predominantly directed parallel to the rotation axis. In some modifications of this method several coils are used, all co-axial with the rotation axis, and with current circulating in the same sense in each coil. The objective of such an arrangement is to provide a much more uniform field over the melt volume. The second geometry is to use a magnet oriented so as to generate a field transverse to the growth direction of the crystal. Such a geometry destroys the rotational symmetry which is generally considered desirable during crystal growth.

While the application of static magnetic fields has been shown to be capable of damping the convective flows within the melt and so reducing the striae, the quality of the crystal may be degraded in other respects. For example in UK Patent GB 2,163,672 A it is proposed that the reduction in heat transport through the melt brought about by the reduced convection can lead to unacceptably high crucible wall temperatures during growth. To avoid this problem the patent suggests that the field be shaped so as to create a low field region in the melt away from the crystal melt interface while retaining a high field close to the crystal.

Another problem which is frequently encountered during growth under a magnetic field is that the radial uniformity of the incorporation of the dopant is degraded. In some cases this can arise as a result of the magnetic field near the crystal/melt interface which damps the crystal driven flows. During the growth of a crystal which is being rotated in the melt it is well known that, as first demonstrated by Burton, Prim and Schlicter, the rotation sets up a centrifugally pumped convective flow in the melt. During the growth, the centrifugal pumping action acts to remove the impurities which are rejected. The magnetic field may act to damp this pumping action so leading to an excess build up of impurities ahead of the growing crystal. Radial variations in the mixing of this liquid with the bulk of the melt will lead to radial variations in the incorporation of these impurities.

In addition to reducing the striae in the crystal, a second advantage which may be gained by the application of a magnetic field to the melt is to reduce the contamination of the melt by the crucible. In the case of silicon growth it has been shown that the application of a transverse field to the melt can under some circumstances, reduce the incorporation of oxygen into the growing crystal.

The present invention improves the radial uniformity of a crystal grown under a magnetic field by shaping the field so as to reduce the damping action on the crystal rotation driven flows. The configuration of the field is such that the flows in the melt responsible for transport of impurities from the crucible to the crystal are damped, so reducing the contamination of the crystal by the crucible.

According to this invention a method of growing semiconductor crystalline materials comprises the steps:
  providing in a crucible a melt of the material to be grown as a crystal,
  dipping a seed crystal into the melt,
  withdrawing and rotating the seed crystal from the melt,
  maintaining a temperature gradient between the melt and seed crystal,
whereby a single crystalline material is grown from the melt, Characterised by:

providing a magnetic field that is substantially rotationally symmetrical about the axis of rotation of the crystal and with a component of field parallel to the axis of crystal rotation that is less than 500 gauss at the interface between growing crystal and melt, with a value of magnetic field above 500 gauss at other parts of the melt, and maintaining this distribution of magnetic field during growth of the crystal, whereby forced convective flows in the melt adjacent the crystal/melt interface are substantially undamped, whilst convective flows in other parts of the melt are damped.

Preferably the axial component of magnetic field at the crystal/melt interface is less than 200 gauss over a region greater than the area of the crystal.

During growth the crucible may be rotated about its axis and raised so as to maintain the correct relation between the crystal melt interface and the magnetic field.

In a modification the magnet assembly may be lowered during growth to maintain the correct relation between the crystal melt interface and the magnetic field.

According to this invention apparatus for growing semiconductor crystalline materials comprises:

a chamber containing an electric heater, a crucible arranged within the heater for containing a charge of the material to be grown, a pull member seed crystal onto which a crystal may be grown, motors for rotating and axially moving the pull member, means for controlling the heater and pull member movement to pull a crystal from a melt established in the crucible, characterised by:

means for providing a magnetic field in the melt, said magnetic field having a plane that is rotationally symmetric about an axis of rotation of the pull member with a component that is less than 500 gauss in a direction along said axis, the magnetic field away from the plane having a magnetic value greater than 500 gauss, means for locating an interface between crystal and melt at said plane so that melt adjacent the interface is subjected to an axial component of magnetic field less than 500 gauss, and melt away from the interface is subject to a magnetic field above 500 gauss, and means for maintaining the relative position of the crystal/melt interface in said magnetic field plane during growth of the crystal.

The pull member may be a rod, ball chain, flexible wire, or similar support.

The magnetic field may be provided by two or more superconducting ring-shaped magnets spaced apart and arranged coaxially with the axis of pull rod rotation.

Alternatively the magnetic field may be generated by conventional resistive electro magnets.

BRIEF DESCRIPTION OF THE DRAWINGS

The invention will now be described, by way of example only, with reference to the accompanying drawings of which.

DETAILED DISCUSSION OF THE PREFERRED EMBODIMENTS

Figure 1:
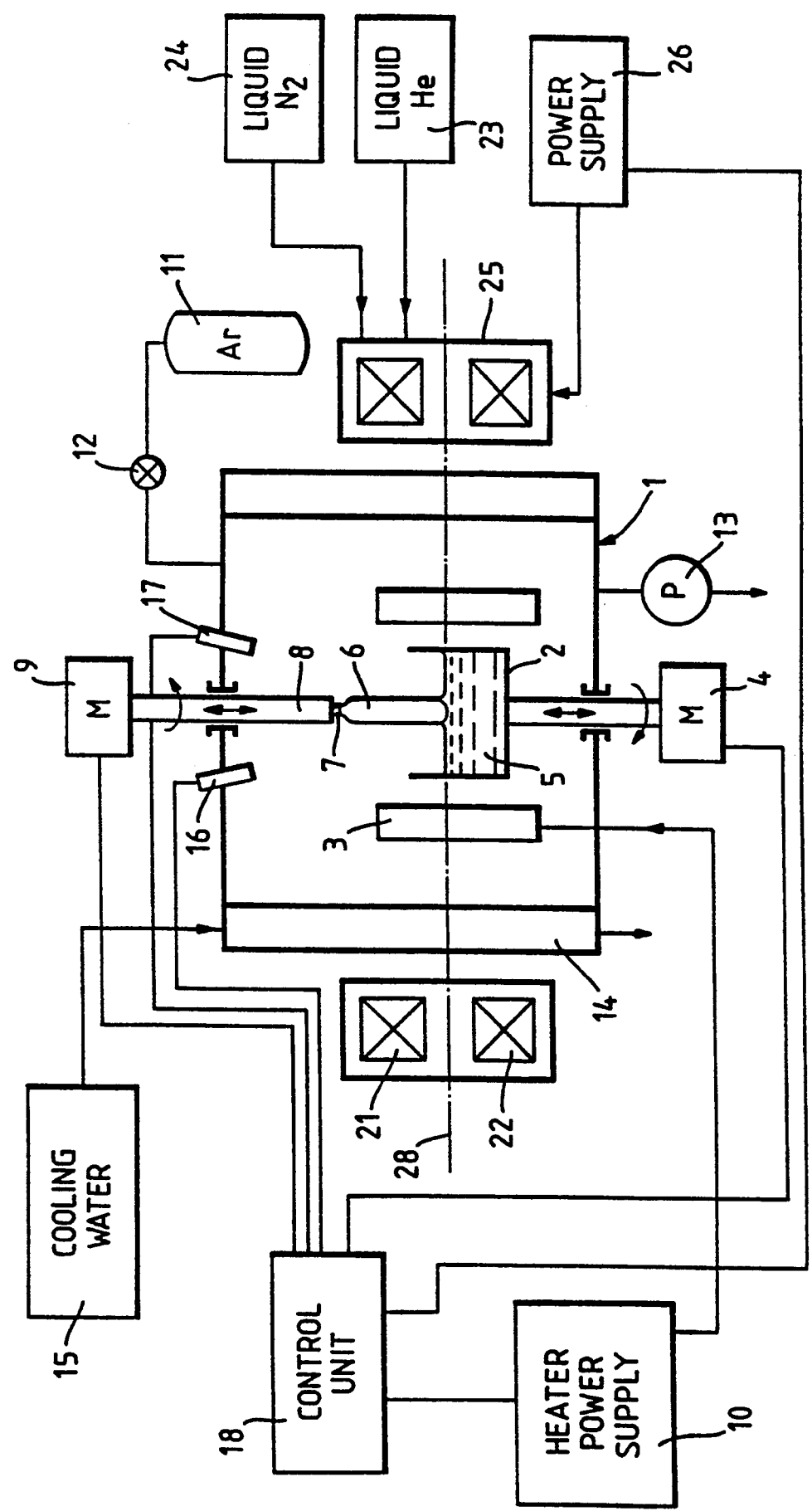
FIG. 1 a view of a Czochralski puller.
Figure 2:
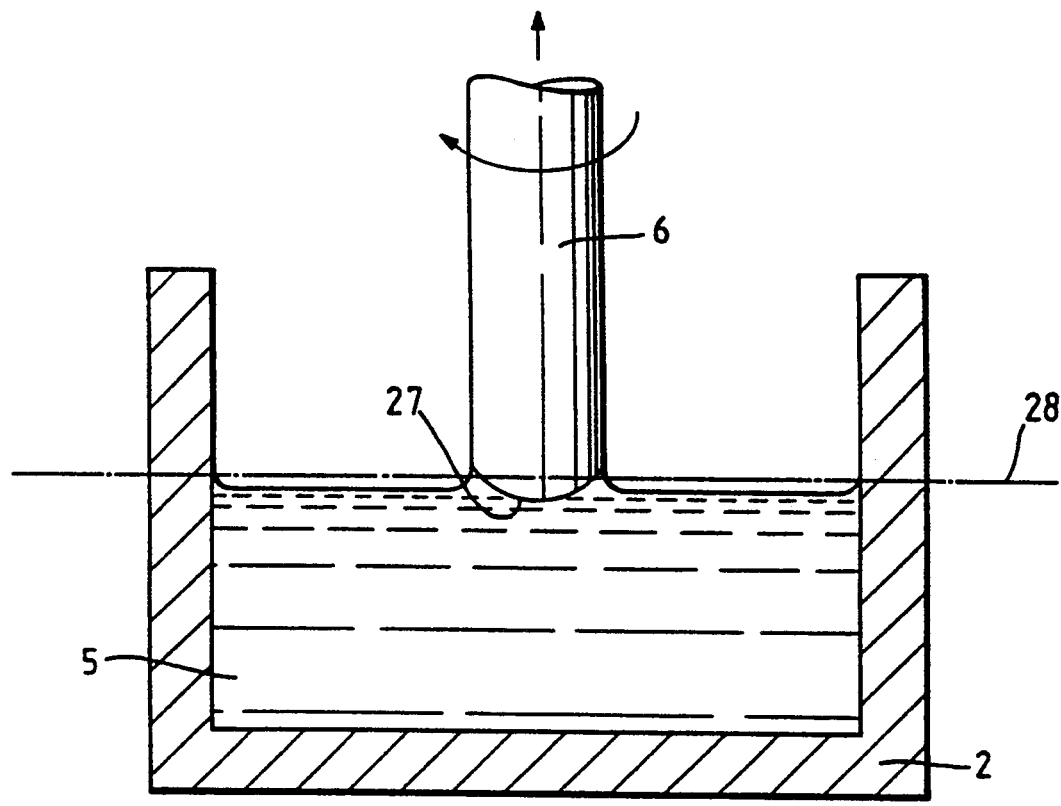
FIG. 2 is an enlarged view of part of FIG. 1 showing the junction between growing crystal and melt.

The Czochralski growth apparatus FIGS. 1, 2 comprises a chamber 1 containing a silica crucible 2 surrounded by a picket fence type of resistance heater 3. The crucible 2 is mounted for rotation and vertical movement by a motor 4. Inside the crucible 2 is an amount of silicon melt 5 from which a crystal 6 is pulled by a seed crystal 7 attached to the bottom of a pull, chain, wire or rod 8. This pull rod 8 is both rotated and moved vertically by a motor 9. Electrical power is fed to the heater from a heater power supply 10. Argon gas is fed from a bottle 11 via a valve 12 to the inside of the chamber 1. Gas is pumped from the chamber 1 by a pump 13 which maintains the pressure below atmosphere, typically at 20 Torr. Cooling water is circulated through a jacket 14 surrounding the chamber 1 and fed from a water supply 15. Two photo diodes 16, 17 of adjustable spacing, are arranged to receive light reflected off the junction between growing crystal 6 and melt 5. This can be observed as a bright ring. The amount of light received by the photo diodes 16, 17 is used in a feed back loop to a control logic unit 18. This control unit may be a programmed computer or analog control system and controls the motors 4 and 9, heater supply 10, pump 13, and coolant supply 15.

FIG. 1 additionally has two super-conducting coils 21, 22 of 520 mm centre diameter spaced 580 mm apart centre to centre surrounding the chamber 1. These coils 21, 22 are cooled by liquid helium, fed from a He supply 23 to provide a super conducting magnet. Additional cooling is from liquid nitrogen, fed from a N supply 24, the complete coils and cooling He, N being encased in a vacuum chamber 25. A magnetic field is set up in the coils 21, 22 by power from a power supply 26. Conventionally this is achieved by heating a small part of each coil to make it resistive and applying power to the remainder of the coil. When the field is at its desired strength the complete coil is made superconducting so that the magnetic field is maintained without external power supply.

Figure 3:
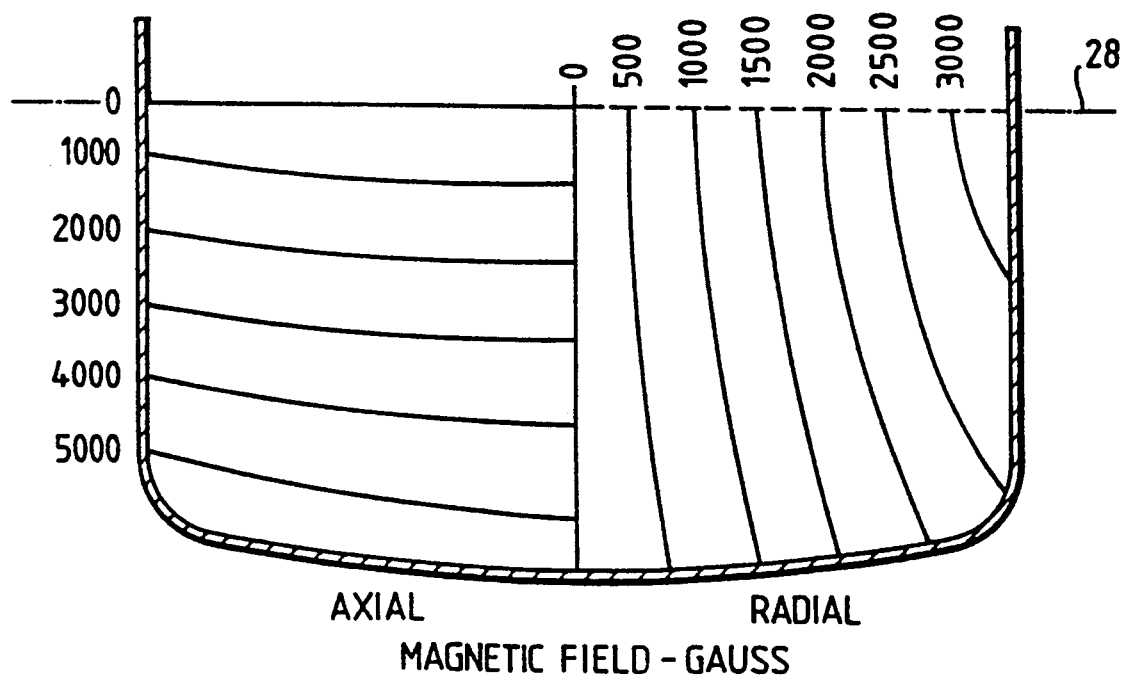
FIG. 3 is a map of the magnetic field contours within a crucible for the apparatus of FIG. 1.

FIG. 3 shows measured magnetic field contours inside a crucible 20.3 mm (8 inch) diameter and 10.15 mm (4 inch) deep when maximum power was applied to the coils 21, 22. The coils 21, 22 can be operated at lower power with a consequential reduction in magnetic field strength.

The coils 21, 22 are arranged coaxially with the rotational axis of the growing crystal 6, pull rod 8, and crucible 2. Electric current is arranged to be passed into the upper coil 21 in a clockwise direction, when seen from above, and into the lower coil 22 in an anticlockwise direction. This results in a radial magnetic field in a plane 28 perpendicular to the axis of the coils 21, 22. In this plane 28 the amount of magnetic field component parallel to the crystal 6 axis, i.e. perpendicular to the plane 28, is less than 200 gauss. Elsewhere the magnetic field will have radial and axial components which in places exceeds 1000 gauss. By way of comparison the earth's magnetic field is typically about 1 gauss. The centre of the plane 28 has zero radial magnetic field. It is important that the plane 28 is correctly positioned relative to the growing crystal. As shown more clearly in FIG. 2 the plane 28 passes through the solid/melt interface 27 with about half of the interface area above and half below the plane 28. During growth of a crystal 6 the level of melt 5 in the crucible 2 drops. To compensate for this the crucible 2 is slowly raised by the motor 4 to maintain the solid/melt interface 27 in the plane 28.

Operation to grow a Si single crystal of 75 mm nominal diameter will now be described. A charge of 6 kgs of Si doped to contain about 10 atoms of phosphorus is arranged in the crucible 2. The chamber 1 is pumped down to about 0.1 Torr to remove air and other contaminants, then argon is admitted from the bottle 11 whilst the pump 13 maintains the pressure at about 20 Torr. An electric current is passed through the heater 3 to melt the charge in the crucible 2 and provide a melt 5, a typical temperature is 1460 C.

The seed crystal 7 is rotated and lowered to make contact with the melt 5. After adjustments to the temperature of the melt 5, the seed 7 is raised at a controlled rate and with a controlled rotation. By controlling the rate of travel of the seed 7 and the temperature of the melt 5 a crystal 6 of silicon of the required diameter may be grown. Initially the growth is increased from the seed diameter until the required 75 mm is reached. An increase in pull rate is needed to grow at a constant diameter. Thereafter the diameter is maintained constant until the end of the run when the melt 5 is depleted. Once the required diameter is reached the photo diodes 16, 17 are adjusted to maintain the required value as variations in diameter are detected as variations in diode output.

Once growth has been established at the required 75 mm diameter, an electric current is passed through the super-conducting coils 21, 22. The result is that the crystal 6 grows in a small axial magnetic field that has insufficient strength to damp the beneficial crystal driven flows in the adjacent melt. However, the magnetic field away from the melt/crystal interface 27 has sufficient strength to damp out the convective flows in the main body of the melt 5. The quality of the crystal 6 is therefore improved through the reduction of the undesirable flows in the bulk of the melt 5 and the retention of the beneficial flows ahead of the growing crystal 6.

As the crystal 6 continues to grow the control unit 18 monitors the output of the photo diodes 16, 17 and makes appropriate adjustments to the heater 3 temperature and crystal pull rate to maintain growth at the desired diameter. Also the position of the crucible 2 is adjusted by the motor 4 during growth to maintain the interface 27 in the radial field plane 28.

Growth is continued until most of the melt has been used. The pull rate is then increased to taper off the crystal diameter and terminate growth. Heater power is stopped the crystal and apparatus allowed to cool. After growth is completed the crystal is removed from the apparatus and ground to the exact diameter required. The crystal is then sliced, edge rounded, chemically and mechanically polished and heat treated ready for the manufacture of electronic integrated circuits.

The principal detailed above may be applied to the growth of any semiconductor crystal from the melt in which the crystal is rotated. For example, the method may be applied to the growth of silicon crystals by either the Czochralski or Float Zone techniques or to the growth of gallium arsenide by the liquid encapsulated Czochralski method.

In the Float Zone technique a zone of melted crystal is gradually moved along a rotating crystal; the material recrystallising behind the moving melt zone. The recrystallising interface is subjected to the same magnetic fields as that in FIGS. 1, 2, 3.

The crucible may be moved during crystal growth to maintain the required relative position of crystal/melt interface and magnetic field. Additionally the crucible may be rotated.

Alternatively the means for providing a magnetic field may be moved during growth to maintain the required relative position of crystal/melt interface and magnetic field.

Figure 4:
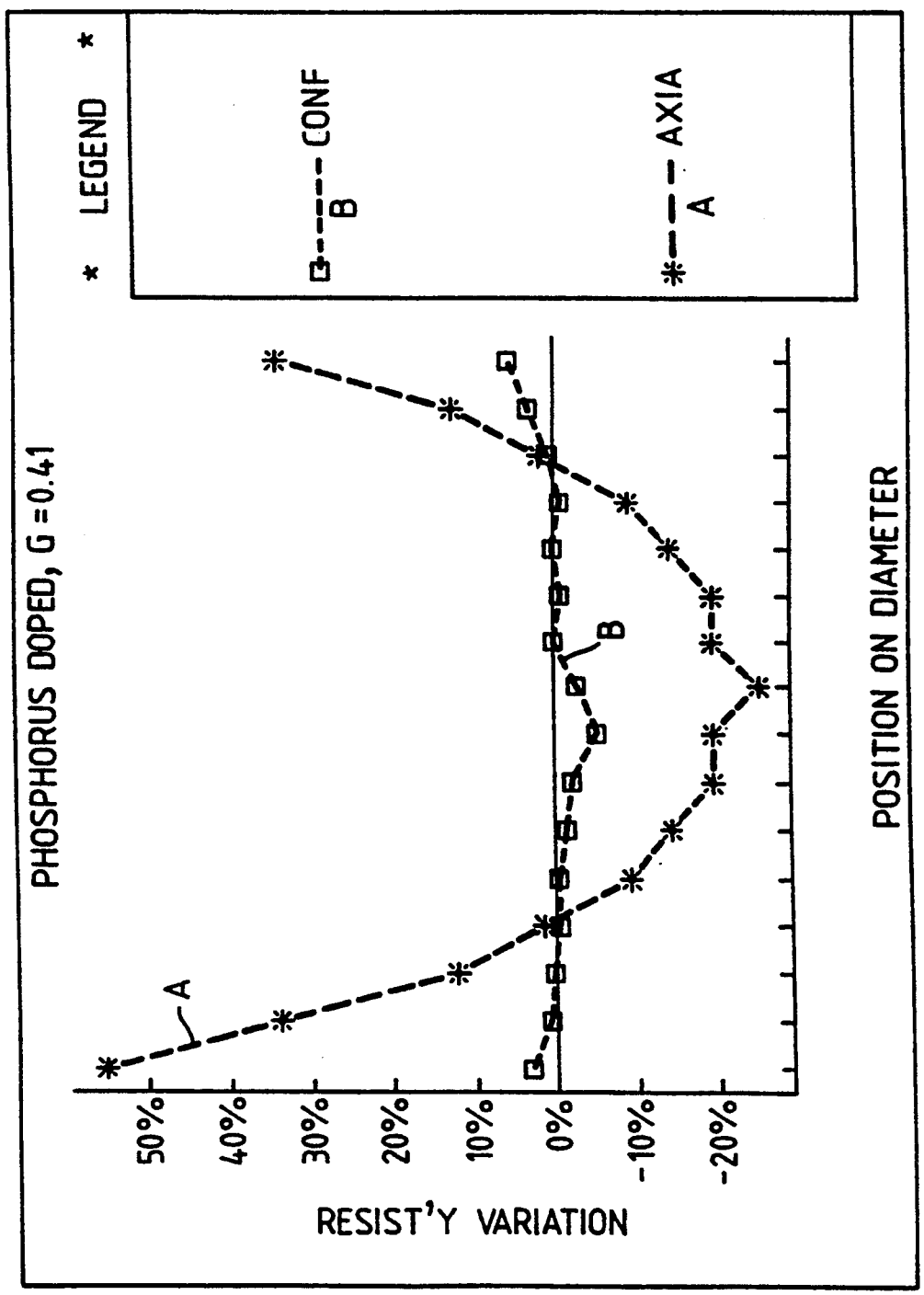
FIG. 4 is a graph showing resistivity variation across a crystal for a crystal grown under high axial magnetic field, and for a crystal grown according to this invention.

One measure of the uniformity of a crystal is its electrical resistivity profile across a wafer. This is shown by FIG. 4 for a phosphorus doped, silicon crystal cut normally from a crystal at a position along the length corresponding to the solid fraction (G)=0.41. The sample shown by curve A was prepared in a Czochralski growth apparatus in which the melt was immersed in a magnetic field whose axial components exceeded 1500 gauss in the plane of the crystal melt interface. The magnetic field has damped the flows driven by the crucible rotation such that there are large radial variations in the dopant concentration and hence resistivity.

The sample shown in curve B was prepared in a Czochralski puller equipped with superconducting solenoids operated such that the component of magnetic field in the plane of the crystal melt interface did not exceed 200 gauss but with the field exceeding 1500 gauss in some other parts of the melt. The magnetic field was designed to retain the rotational symmetry of the system. The radial profile of the resistivity is very much improved since the field has been shaped to minimise the damping of the crystal rotation driven flows.

Figure 5:
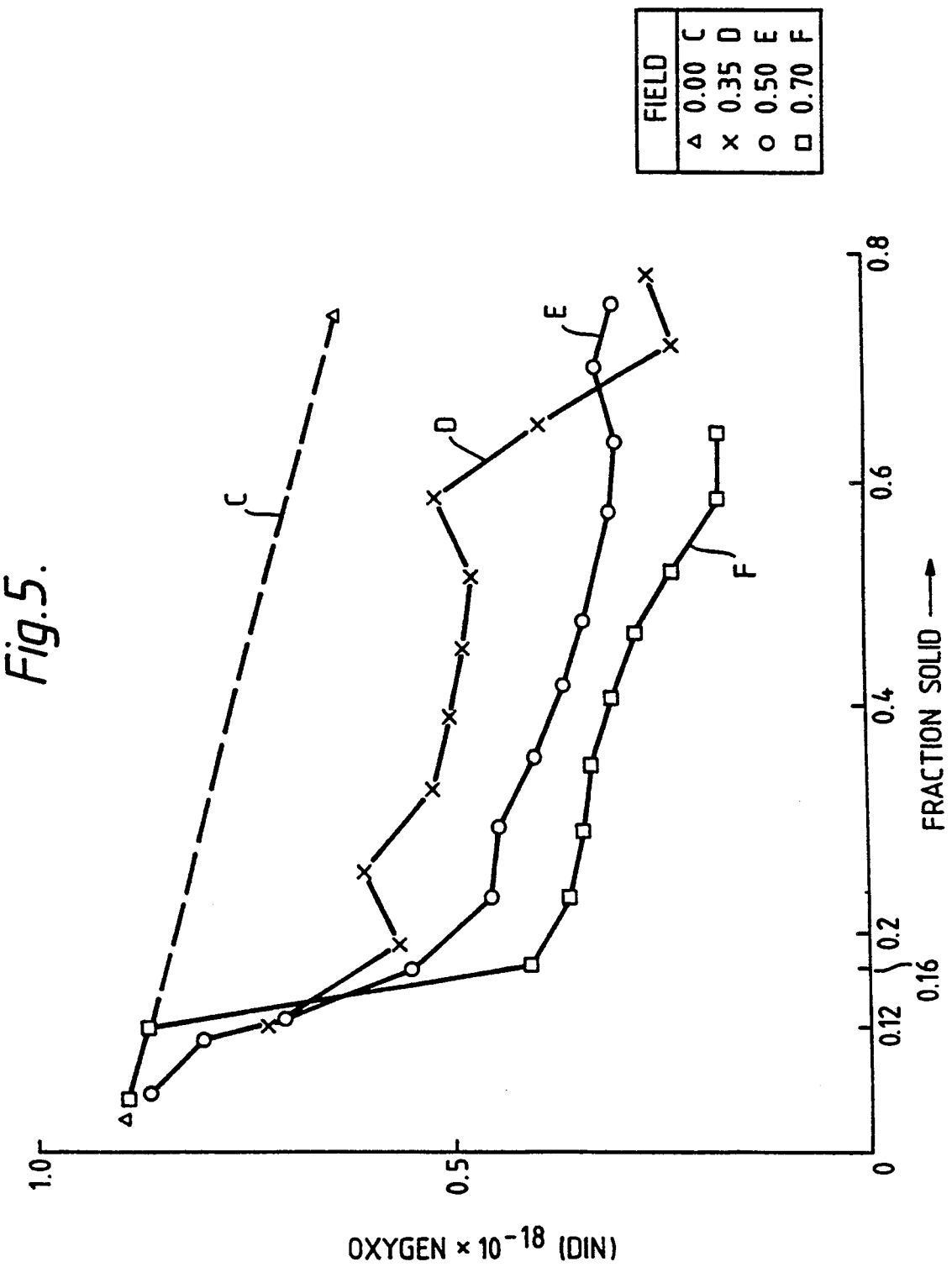
FIG. 5 is a graph showing the oxygen content of crystals grown under different magnetic fields.

The effect of varying the magnetic field strength is shown in FIG. 5. The vertical axis shows oxygen content and the horizontal axis shows the fraction of the original crucible melt and hence represents length measured along a grown crystal. Only about 0.8 of a melt is useful; the remaining 0.2 contains impurities and is often left in the crucible after crystal growth. A grown crystal is sliced and its oxygen content measured at different positions along its length. The broken line (curve C) represents oxygen content variation with no applied magnetic field. As the applied magnetic field is increased to 0.35 (curve D), 0.5 (curve E), and 0.70 (curve F) of maximum strength, the oxygen content is observed to reduce. At the start of crystal growth the magnetic field was not applied. This assisted in growing out to the required diameter. After the magnetic field is applied there is a drop in oxygen content. This is most marked for the 0.70 magnetic strength curve where the magnetic strength is started at about 0.12 fraction solid and is fully on at about 0.16 fraction solid. Alternatively the entire crystal from seed-on may be grown under the magnetic field.

We claim:

1. A method of growing semiconductor crystalline materials comprising the steps:
    providing in a crucible a melt of the material to be grown as a crystal,
    dipping a seed crystal into the melt,
    withdrawing and rotating the seed crystal from the melt, maintaining a temperature gradient between the melt and seed crystal, whereby a single crystalline material is grown from the melt, during said withdrawing and rotating step, providing a magnetic field that is substantially rotationally symmetrical about the axis of rotation of the crystal and with a component of field parallel to the axis of crystal rotation that is less than 500 gauss at the interface between growing crystal and melt, with a value of magnetic field above 500 gauss at other parts of the melt, and maintaining this distribution of magnetic field during growth of the crystal, whereby forced convective flows in the melt adjacent the crystal/melt interface are substantially undamped, whilst convective flows in other parts of the melt are damped.

2. The method of claim 1 wherein the component of field parallel to the axis of crystal rotation is less than 200 Gauss at the interface between growing crystal and melt.

3. The method of claim 1 wherein the crucible is rotated about its axis during growth of the crystal.

4. The method of claim 1 wherein the crucible is raised during growth of the crystal.

* * * * *